United States Patent [19]

Tomita et al.

[11] 4,445,034

[45] Apr. 24, 1984

[54] COMPOUND INFRARED DETECTOR

[75] Inventors: Katsuhiko Tomita; Ken Katsuki; Toshiyuki Kuritani, all of Kyoto, Japan

[73] Assignee: Horiba, Ltd., Kyoto, Japan

[21] Appl. No.: 331,469

[22] Filed: Dec. 16, 1981

[30] Foreign Application Priority Data

Dec. 20, 1980 [JP] Japan .................................. 55-180634

[51] Int. Cl.³ ................................................ G01J 1/00
[52] U.S. Cl. .................................... 250/338; 250/342; 250/349
[58] Field of Search ............... 250/338, 340, 342, 349, 250/352

[56] References Cited

U.S. PATENT DOCUMENTS

| | | | |
|---|---|---|---|
| 3,267,727 | 8/1966 | Benzinger | 250/338 |
| 4,024,560 | 5/1977 | Miller et al. | 250/340 |
| 4,300,048 | 11/1981 | Barbier et al. | 250/338 |

Primary Examiner—Janice A. Howell
Attorney, Agent, or Firm—Wenderoth, Lind & Ponack

[57] ABSTRACT

A compound infrared detector, having a thermopile detector which is constructed on one face of a pyroelectric insulating thin film and a pyroelectric detector which is constructed by installing electrodes on both faces of the insulating thin film in opposite relationship to an infrared ray responsive portion thereof.

The compound infrared detector of the present invention can function both as a pyroelectric detector and as a thermopile detector. In addition, the pyroelectric detector and the thermopile detector can be installed on the identical focus of the identical optical system because they have a common infrared ray responsive portion and as a result thereof, the number of detectors and also the number of optical adjusting means and optical parts can be reduced relative to those used in the prior case when two detectors are used; that is, the mutual compensation effect of both kinds of detectors can be inexpensively attained.

2 Claims, 9 Drawing Figures

COMPOUND INFRARED DETECTOR

BACKGROUND OF THE INVENTION

1. Field of the Invention

The present invention relates to an infrared detector; in particular, the present invention relates to a compound infrared detector in which a pyroelectric detector is combined with a thermopile detector.

2. Description of the Prior Art

As shown in FIG. 1, a known pyroelectric detector consists of a thin pyroelectric element 1 provided with electrodes 2 and 3 on both faces thereof; the electrodes 2 and 3 are connected to terminals 5 and 6 on a substrate 4 holding the thin element 1; output signals from terminals 5 and 6 are fed to a junction FET for effecting an impedance transformation; the output of the FET is then connected to an outside terminal.

As shown in FIG. 2, a known thermopile detector comprises a circular or rectangular thermopile, consisting of a first thermopile material 8 and a second thermopile material 9, constructed on a thin insulating film 7. Minute differences in the temperatures between a cold junction, fixedly mounted on the thick substrate 4 of a large capacity through said thin insulating film 7, and a central hot junction, upon which infrared rays are incident, generate signals which are fed to an outside terminal.

Although a pyroelectric detector can have a high sensitivity, it is a detector of the differential type, and as a result thereof, it provides detection signals only for sudden changes in the intensity of infrared rays; that is to say, only during sudden temperature gradients when an optical chopping means is not included.

On the other hand, although a thermopile detector can provide detection signals in accordance with slow changes in temperature, it has a relatively low sensitivity.

Although both kinds of detectors can be used in such a manner that they compensate each other by means of the suitable treatment of their signals, they cannot be placed on the identical focus of the identical optical system. For this reason, prior art using two detectors have a defect in that the number of detectors required and also the number of optical adjusting means, optical parts and the like is increased and accordingly, such a detection apparatus becomes extremely expensive as a whole.

SUMMARY OF THE INVENTION

An object of the present invention is to provide a compound infrared detector which functions both as a pyroelectric detector and as a thermopile detector and by which the aforementioned defects incidental to the prior art can be eliminated.

DESCRIPTION OF THE PREFERRED EMBODIMENTS

Figure 1:
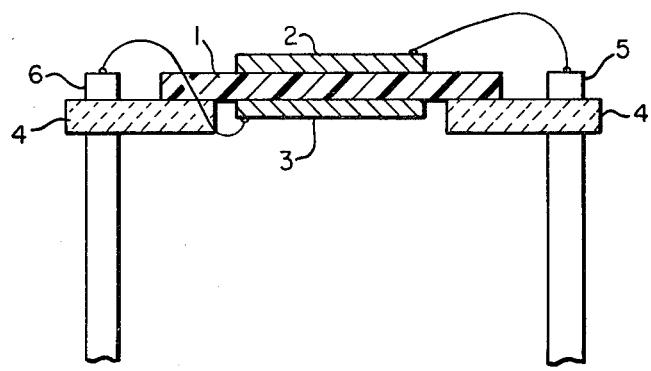
FIG. 1 is a longitudinal cross-section of a pyroelectric detector in accordance with the prior art.
Figure 2:
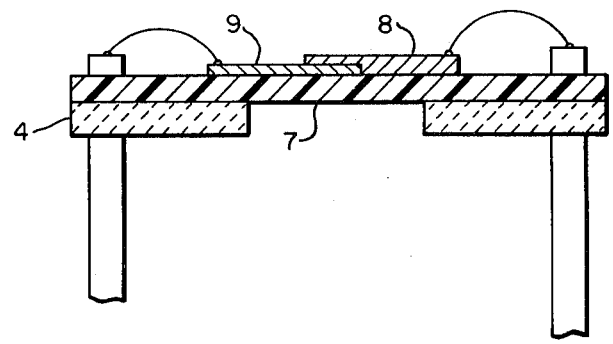
FIG. 2 is a longitudinal cross-section of a thermopile detector in accordance with the prior art.
Figure 3:
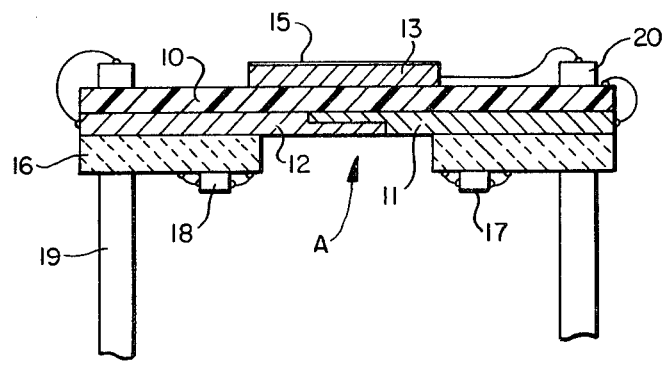
FIG. 3 is a diagrammatical view showing a compound infrared detector in accordance with the present invention.
Figure 4:
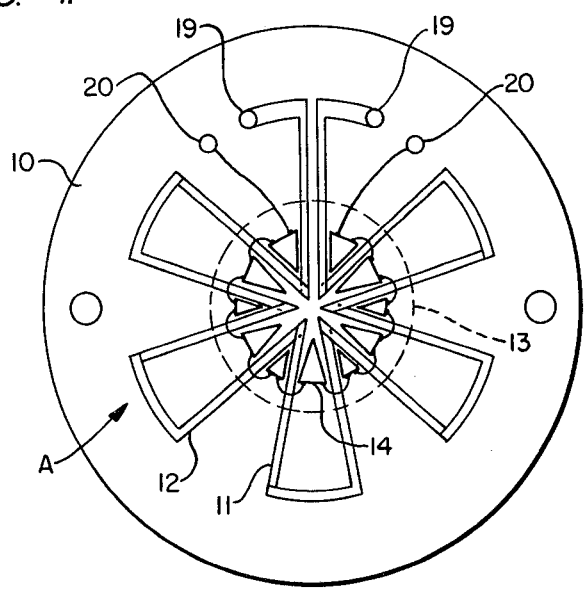
FIG. 4 is a bottom view of the main parts of the present invention.
Figure 5:
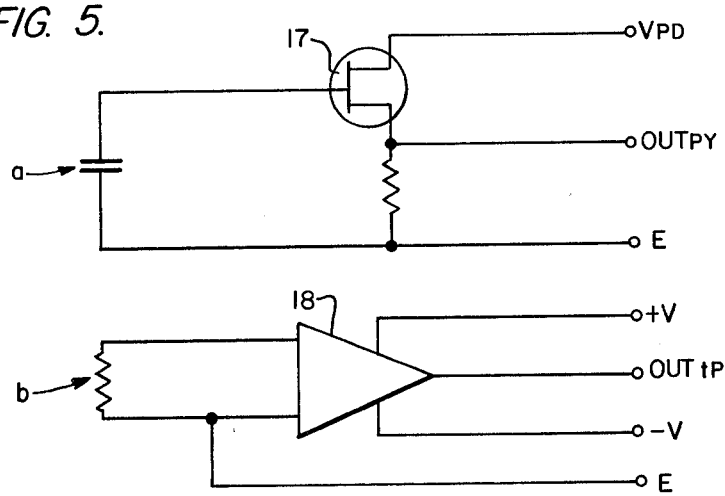
FIG. 5 is an electric circuit of the present invention.

The preferred embodiments of the present invention will be described hereinafter by reference to the drawings, in which FIGS. 3 to 5 show an example of a compound infrared detector according to the present invention. Referring now to the drawings, a pyroelectric insulating thin film 10 is provided; $PVF_2$ (polyvinylidenefluoride), a composite pyroelectric film consisting of an organic film and PZT and the like, or a procelain thin film of PZT $PbTiO_3$, $LiTaO_3$ and the like may be used as the thin film 10.

A thermopile A which has an appropriate shape and consists of a first thermopile material 11 and a second thermopile substance 12 is constructed on an under face of the thin film 10. A pair of electrodes consisting of an upper electrode 13 and an under electrode 14 is mounted on both an upper face and an under face of the thin film 10 at the position opposite to an infrared responsive portion of the thermopile A, that is, the hot junction formed in the central portion of the thermopile A; a blackening film 15 is coated on the electrode 13 of the upper face side (incident face side) of the thin film 10. The thin film 10 is mounted on a substrate 16 of alumina or the like having a large heat capacity. A hybrid circuit which is provided with a junction FET 17 for use as a pyroelectric detector (a) and a hybrid circuit which is provided with an operational amplifier 18 for use as a thermopile detector (b) is formed on the under face of the substrate 16. A lead terminal 19 of the thermopile detector and a lead terminal 20 of the pyroelectric detector is provided. $V_{PD}$, $+V$ and $-V$ designate input voltage terminals, E designates a ground terminal, $OUT_{py}$ designates an output terminal of the pyroelectric detector (a), and $OUT_{tp}$ designates an output terminal of the thermopile detector (b). A compound infrared detector having the above described construction functions as the pyroelectric detector, as well as the thermopile detector because of the fact that the pyroelectric film 10 is used instead of an insulating film, which has been conventionally used for the general thermopile detector. The pyroelectric film 10 is provided with electrodes 13 and 14 on the faces thereof. In addition, both the pyroelectric detector (a) and the thermopile detector (b) can be installed at the identical focus of the identical optical system because they have common infrared responsive portions.

Figure 6:
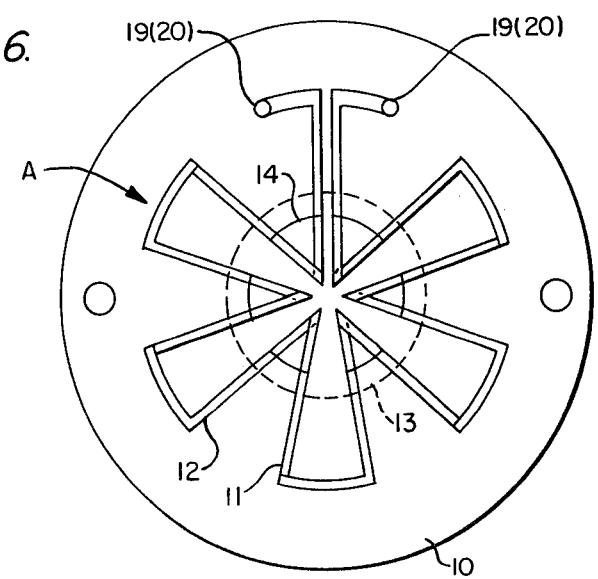
FIG. 6 and FIG. 7 is a bottom view of the main parts and an electric circuit of another example of the present invention.
Figure 7:
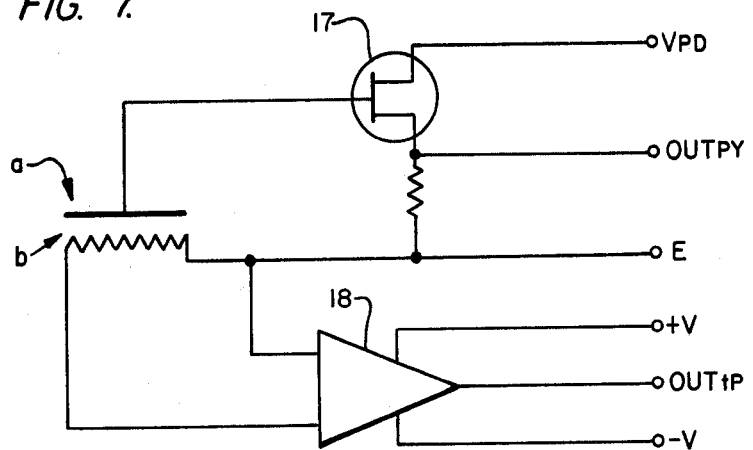

FIGS. 6 and 7 show a second example of a compound infrared detector of the present invention, characterized by the fact that the hot junction of the thermopile A is also used as the under face side electrode 14 of the thin film 10 opposite to the upper face side electrode 13 of the thin film 10.

The description of the rest of the construction of the second example thereof is omitted because it is substantially the same as the above described first example.

Figure 8:
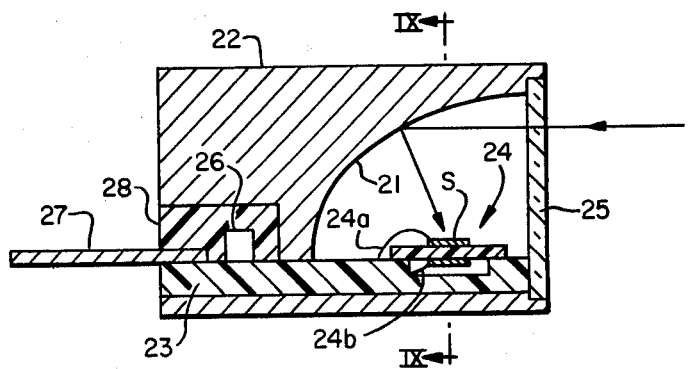
FIG. 8 is a longitudinal cross-section of another example of a compound infrared detector of the present invention.
Figure 9:
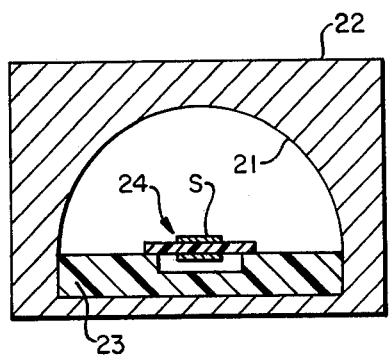
FIG. 9 is a cross-sectional view taken along the line IX—IX of FIG. 8.

FIGS. 8 and 9 show still another example of a compound infrared detector of the present invention, in which a compound infrared detector is arranged in the neighborhood of the focus of a concave mirror such that the light-receiving surface of the pyroelectric detector may be placed parallel to an optical axis of the concave mirror.

Referring now to FIGS. 8 and 9, a concave mirror 21, having a parabolic surface which is divided into two equal parts by a flat surface, is affixed to a case 22 made of metal or plastic. An insulating substrate 23, which is arranged parallel to an optical axis of said concave mirror 21, is also fixedly mounted on the case 22. A compound infrared detector of the present invention is mounted on the insulating substrate 23 in the neighborhood of the focus of the concave mirror 21 such that the flat and blackened light-receiving surface S of the pyroelectric element (pyroelectric film) 24 may be placed parallel to the optical axis. Lead wires 24a and 24b, which are connected to a printed circuit (not shown) on the insulating substrate 23, an optical window 25, which is transparent to infrared rays, a junction FET and a hybrid circuit 26, which is mounted on an end side of the insulating substrate 23, a lead pin 27, and sealing adhesives 28 are also provided.

According to the above described construction, the light-receiving surface S of the pyroelectric element 24 is arranged parallel to an optical axis of the concave mirror 21. Accordingly, the field of vision can be widened as far as possible because the shaded portion of the pyroelectric element 24 is small relative to the size of the pyroelectric element 24.

A compound infrared detector of the present invention can function both as a pyroelectric detector and as a thermopile detector. In addition, the pyroelectric detector and the thermopile detector can be installed on the identical focus of the identical optical system because they have a common infrared ray responsive portion (light-receiving surface portion) and as a result thereof, the number of detectors and also the number of optical adjusting means and optical parts can be reduced relative to those used in the prior art case when two detectors are used; that is, the mutual compensation effect of both kinds of detectors can be inexpensively attained.

What is claimed is:

1. A compound infrared detector, comprising a thermopile detector which is fabricated on one face of a two faced pyroelectric insulating thin film and a pyroelectric detector which is fabricated by providing electrodes on both of said faces of said insulating thin film in opposite relationship to an infrared ray responsive portion thereof.

2. A compound infrared detector as in claim 1, wherein one of said electrodes of said pyroelectric detector also comprises a hot junction of said thermopile detector.

* * * * *